United States Patent
Choi et al.

(10) Patent No.: US 7,274,036 B2
(45) Date of Patent: Sep. 25, 2007

(54) GATE SHORTED TO BODY THIN FILM TRANSISTOR, MANUFACTURING METHOD THEREOF, AND DISPLAY INCLUDING THE SAME

(75) Inventors: Byoung-Deog Choi, Seoul (KR); Won-Sik Kim, Seoul (KR); Myeong-Seob So, Cheonan-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 10/910,350

(22) Filed: Aug. 4, 2004

(65) Prior Publication Data

US 2005/0035343 A1 Feb. 17, 2005

(30) Foreign Application Priority Data

Aug. 14, 2003 (KR) .................. 10-2003-0056594

(51) Int. Cl.
| | |
|---|---|
| H01L 29/04 | (2006.01) |
| H01L 29/10 | (2006.01) |
| H01L 31/00 | (2006.01) |
| H01L 29/12 | (2006.01) |
| H01L 29/786 | (2006.01) |
| H01L 27/01 | (2006.01) |
| H01L 27/12 | (2006.01) |

(52) U.S. Cl. .................. 257/57; 257/71; 257/350; 257/352; 257/E29.117
(58) Field of Classification Search .............. 257/347, 257/350, 352, 353, E29.117, 57, 71
See application file for complete search history.

(56) References Cited

U.S. PATENT DOCUMENTS

| | | | | |
|---|---|---|---|---|
| 3,577,019 | A | * | 5/1971 | Storm ..................... 327/541 |
| 6,104,040 | A | * | 8/2000 | Kawachi et al. ............ 257/59 |
| 2002/0109187 | A1 | * | 8/2002 | Matsumoto et al. ....... 257/347 |
| 2004/0124869 | A1 | * | 7/2004 | Lee et al. .................. 324/770 |

FOREIGN PATENT DOCUMENTS

EP 0 816 903 1/1998

OTHER PUBLICATIONS

Assaderaghi, et al., "A Dynamic Threshold Voltage MOSFET (DTMOS) for Ultra-Low Voltage Operation," Technical Digest, IEEE, pp. 809-812 (Dec. 11, 1994).

* cited by examiner

*Primary Examiner*—Ngân V. Ngô
(74) *Attorney, Agent, or Firm*—Stein, McEwen & Bui, LLP

(57) ABSTRACT

A TFT including a gate metallic layer, a body layer doped with a dopant having a first polarity, a source layer and a drain layer doped with a dopant having a second polarity, a semiconductor layer formed between the source layer and the drain layer, and a contact coupling the gate metallic layer and the body layer.

21 Claims, 7 Drawing Sheets

[Pixel unit]    [Circuit unit]

[Pixel unit]    [Circuit unit]

[Pixel unit]   [Circuit unit]

GATE SHORTED TO BODY THIN FILM TRANSISTOR, MANUFACTURING METHOD THEREOF, AND DISPLAY INCLUDING THE SAME

CROSS-REFERENCE TO RELATED APPLICATIONS

This application claims the benefit of Korean Patent Application No. 2003-56594, filed on Aug. 14, 2003, in the Korean Intellectual Property Office, the disclosure of which is incorporated herein by reference.

BACKGROUND OF THE INVENTION

1. Field of the Invention

The present invention relates to improved TFTs (thin film transistors) and a manufacturing method thereof. More specifically, the present invention relates to TFTs which obtain a high drain current at a low voltage, and a manufacturing method thereof.

2. Description of the Related Art

FIG. 1 shows a configuration of a conventional n-channel MOSFET (metal oxide semiconductor field-effect transistor).

A TFT is a kind of MOSFET, wherein semiconductor thin films of amorphous silicon or polycrystalline silicon are formed on a glass substrate, and the FET structure is generated on the semiconductor thin films.

As shown in FIG. 1, electrical conduction on a current path (i.e., a channel) between a source, which corresponds to a cathode, and a drain, which corresponds to an anode, is controlled by a voltage $V_{GS}$ of a gate contacted at an oxide film on the channel in the MOSFET.

The source and the drain are formed by generating two n-type layers 20a and 20b on the p-type silicon substrate 10. The gate includes three layers of metal, oxide, and semiconductor, and an electrode 30 is formed on an oxide film 40 between the source and the drain on the substrate.

Basically, On/Off states between the drain and the source of the TFT are controlled by a voltage supplied to the gate, which is a third electrode. No current flows between the drain and the source in the Off operation, and the current flows therebetween in the On operation. When the gate voltage becomes greater than a predetermined voltage (a threshold voltage), the transistor is turned on.

The operation region of the TFT is divided into a linear region and a saturation region in the same manner as the MOSFET. When the drain voltage is small, the drain current is proportional to the drain voltage since the characteristics between the drain and the source give ohmic characteristics. When the drain voltage becomes large and the gate voltage is neutralized, the channel is pinched off from the drain, and the drain current no longer increases and has a constant value irrespective of increase of the drain voltage.

When the potential of the source n-type layer 20b is set as 0, and when the drain current is saturated, the drain voltage $V_{DS}$ corresponds to a difference between the applied gate voltage $V_{GS}$ and the threshold voltage $V_{th}$. Therefore, a high drain voltage $V_{DS}$ is required so as to obtain a stable saturation current in the drain region in the case of the polycrystalline silicon TFT on the glass substrate. However, power consumption also increases as the drain voltage $V_{DS}$ increases. Low power consumption of portable devices such as mobile stations or PDAs is an important technical target in the corresponding field, and it is essential to save the power for driving organic displays in the portable device.

SUMMARY OF THE INVENTION

It is an aspect of the present invention to provide a TFT which reduces power consumption of a display using TFTs, and a manufacturing method thereof.

It is another aspect of the present invention to provide a TFT which provides a lower threshold voltage and improved drain current characteristics, and a manufacturing method thereof.

Additional aspects and/or advantages of the invention will be set forth in part in the description which follows and, in part, will be obvious from the description, or may be learned by practice of the invention.

In one aspect of the present invention, a TFT comprises: a gate metallic layer; a body layer doped with a dopant having a first polarity; a source layer doped with a dopant having a second polarity; a drain layer doped with the dopant having the second polarity; a semiconductor layer formed between the source layer and the drain layer; an oxide film layer formed between the gate metallic layer and the semiconductor layer; and a contact coupling the gate metallic layer and the body layer.

The body layer may be formed on the same layer as that of the semiconductor layer, and is formed separately from a channel coupling the source layer and the drain layer.

The semiconductor layer may comprise polycrystalline silicon.

In one aspect of the present invention, a method of manufacturing a TFT comprises: forming a semiconductor layer having a first part and a second part; implanting a dopant of a first polarity into the first part; forming a first contact to be coupled to the first part; depositing an oxide layer on the semiconductor layer except at the first contact and the second part; forming a gate metallic layer on the oxide layer so as to be coupled to the first contact; implanting a dopant of a second polarity into the second part; and forming second contacts at the second part.

The implanting the dopant of the second polarity into the second part may include forming a source and a drain, and the first part may be formed separately from a channel between the source and the drain.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
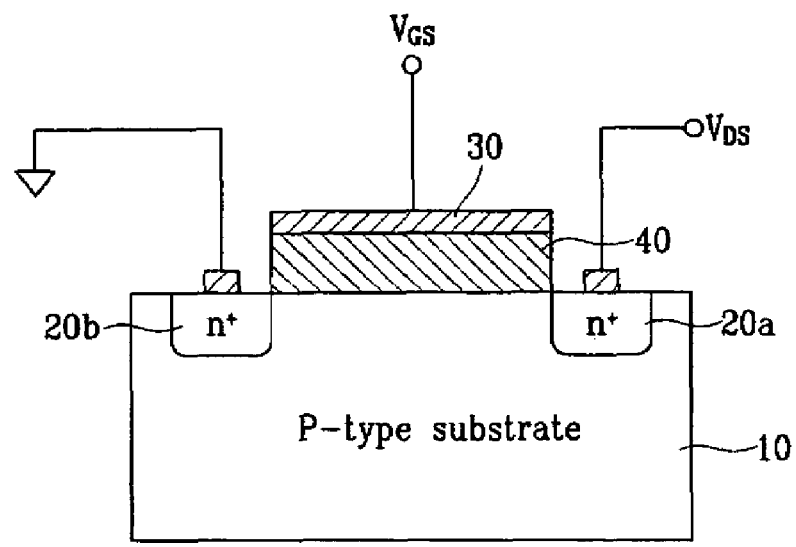
FIG. 1 shows a conventional n-channel field-effect transistor.

Reference will now be made in detail to the embodiments of the present invention, examples of which are illustrated in the accompanying drawings, wherein like reference numerals refer to the like elements throughout. The embodiments are described below to explain the present invention by referring to the figures.

As will be realized, the invention is capable of modification in various respects, all without departing from the invention. Accordingly, the drawings and description are to be regarded as illustrative in nature, and not restrictive.

Figure 2:
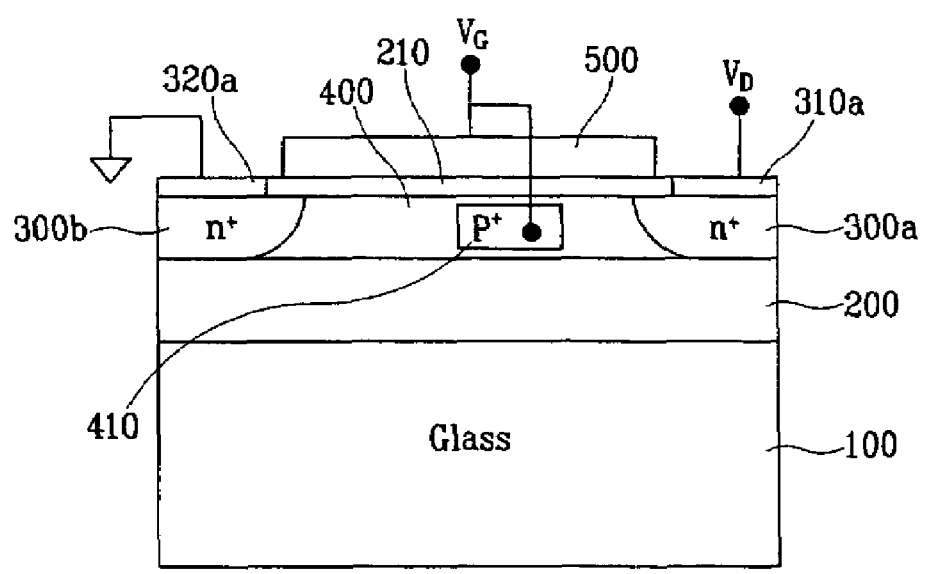
FIG. 2 shows a structure of an n-channel TFT according to an embodiment of the present invention.

FIG. 2 shows a structure of an n-channel TFT according to an embodiment of the present invention.

The TFT comprises a glass substrate layer 100, a buffer oxide film layer 200, n+ semiconductor layers 300a and 300b, an intrinsic semiconductor layer 400, a p+ semiconductor layer 410, an insulated oxide film layer 210, a drain electrode 310a, a source electrode 320a, and a gate electrode 500. The n+ semiconductor layer 300a forms a drain, the n+ semiconductor layer 300b forms a source, the gate electrode 500 is coupled to a body formed with the p+ semiconductor layer 410, and it is desirable to form an access of the gate to the body of the p+ semiconductor layer 410 through a contact.

The body of the p+ semiconductor layer 410 is formed within the intrinsic semiconductor layer, and it is formed so as to not interfere with the channel between the source and the drain (the formation is not illustrated in FIG. 2).

The semiconductor layers shown in FIG. 2 will be exemplified with the polycrystalline silicon, and it is also applicable to the amorphous silicon, which would be apparent to a person skilled in the art. Further, this embodiment of the TFT for realizing a display includes the glass substrate layer 100 and the buffer oxide film layer 200, however, the layers 100 and 200 are optional, as would be apparent to a person skilled in the art.

To understand the features of this embodiment of the present invention, a case in which a potential of a substrate (or a body) is different from the potential of a source is considered. In general, a body bias with respect to the source is a reverse bias in the MOSFET structure, and the threshold voltage $V_{th}$ is increased as the voltage $V_{SB}$ between the source and the body is increased, as given in Equation 1.

$$V_{th} \propto r \sqrt{\sqrt{2\phi_F - V_{SB}}}$$  Equation 1 where r is a constant, and $\phi_F$ is a potential difference between a Fermi energy and the intrinsic semiconductor's Fermi energy.

Therefore, the embodiment shown in FIG. 2 couples the gate electrode 500 and the body of the p+ semiconductor layer 410 to dynamically vary the threshold voltage $V_{th}$. That is, when the gate voltage $V_G$ is zero volts, the threshold voltage $V_{th}$ has a high value, but when a positive voltage is applied to the gate voltage $V_G$, the threshold voltage $V_{th}$ has a low value.

In other words, when the TFT is turned on, the source-body bias forms a forward bias to eliminate a barrier, and accordingly, the threshold voltage $V_{th}$ is lowered to obtain a high drain current at a low gate voltage.

When the TFT is turned off, the gate voltage becomes zero volts, and the source-body bias becomes zero volts or forms a reverse bias to increase the threshold voltage $V_{th}$, thereby showing low drain current characteristics, and accordingly, a leakage current is reduced to thus improve turn-off characteristics.

Figure 3A:
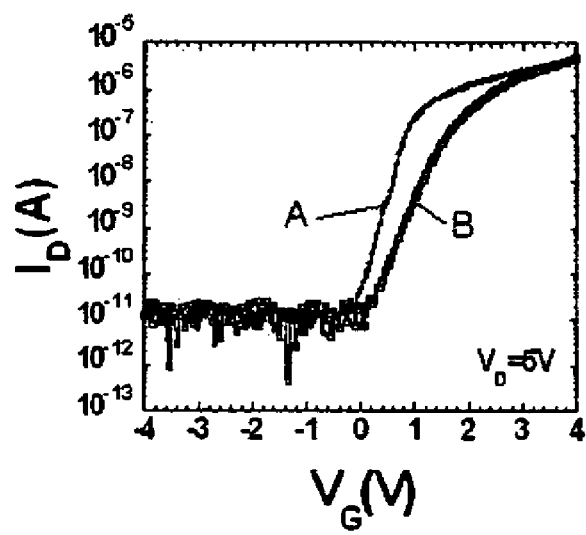
FIGS. 3A and 3B show characteristic comparison graphs of a conventional TFT and a TFT according to an embodiment of the present invention.
Figure 3B:
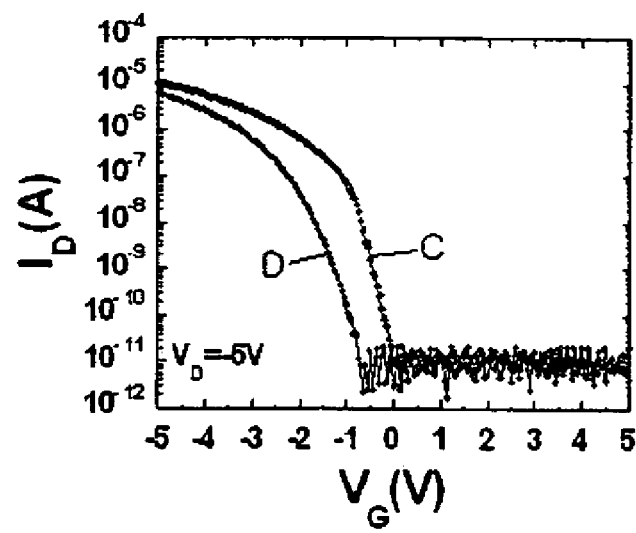

FIGS. 3A and 3B show characteristic comparison graphs of a conventional TFT and a TFT according to two embodiments of the present invention. In detail, FIG. 3A shows experimental data obtained from comparing the n-type TFT characteristics, and FIG. 3B shows experimental data obtained from comparing the p-type TFT characteristics.

Curves A and C illustrate variations of the drain current $I_D$ with respect to the gate voltage $V_G$ in the TFT structure according to these two embodiments of the present invention, and curves B and D illustrate variations of the drain current $I_D$ with respect to the gate voltage $V_G$ in the conventional floating body TFT structure.

As shown in FIGS. 3A and 3B, for these two embodiments of the present invention, the curves have steep gradients to generate saturation states at small threshold voltages, and also give higher drain currents at small gate voltages than the conventional art.

Therefore, a power supply voltage for driving the gate voltage is reduced, and power consumption needed for driving the TFT is decreased. Also, since the turn-off characteristics are improved as described above, the leakage current, which is a problem in the polycrystalline silicon TFT, is reduced.

The TFT according to an embodiment of the present invention may be manufactured during the conventional process without an additional process, thereby requiring no further process costs, which will be described below.

FIGS. 4 to 9 show a progression of forming the TFT according to an embodiment of the present invention.

Figure 4:
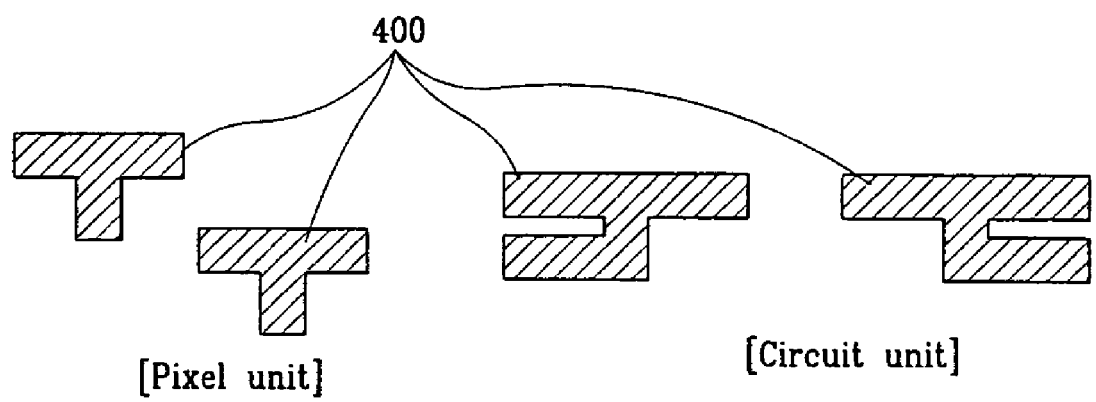
FIGS. 4 to 9 illustrate a progression of forming the TFT according to an embodiment of the present invention.

As shown in FIG. 4, a semiconductor active layer 400 needed for a pixel unit and a circuit unit is formed. Methods of manufacturing the polycrystalline silicon thin films may include an LPCVD (low pressure chemical vapor deposition) method of depositing the polycrystalline silicon on a substrate by using a CVD (chemical vapor deposition) method at a temperature of over 600° C.; an SPC (solid phase crystallization) method of generating amorphous silicon thin films, performing a long thermal process on them at a temperature of over 550° C., and crystallizing the thermal-processed resultant; and an ELA (excimer laser annealing) method of depositing the amorphous silicon films to about 60 nm, scanning laser beams thereon to instantly melt the silicon (Si), and re-crystallizing the same. The above-described active-layer-forming processes, as well as other possible processes, are optional to a person skilled in the art, according to process conditions.

Figure 5:
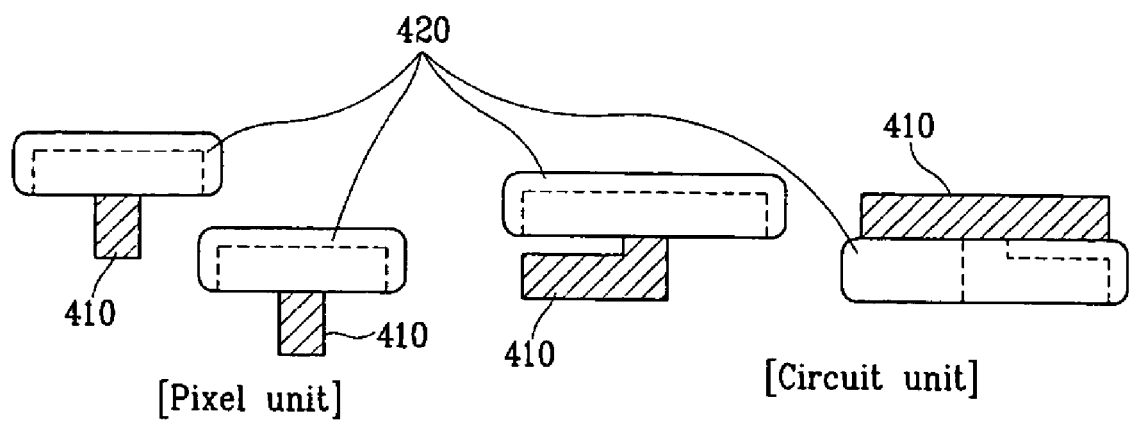

When the semiconductor active layer 400 is formed, a doping process as illustrated in FIG. 5 is performed.

Masks 420 are provided on the formed semiconductor active layer 400, and the desired dopant is implanted into exposed parts of the semiconductor active layer 400 to perform a doping process. Portions exposed from the masks form the body of the p+ semiconductor layer 410. This body could alternatively be formed of an n+ semiconductor layer.

Figure 6:
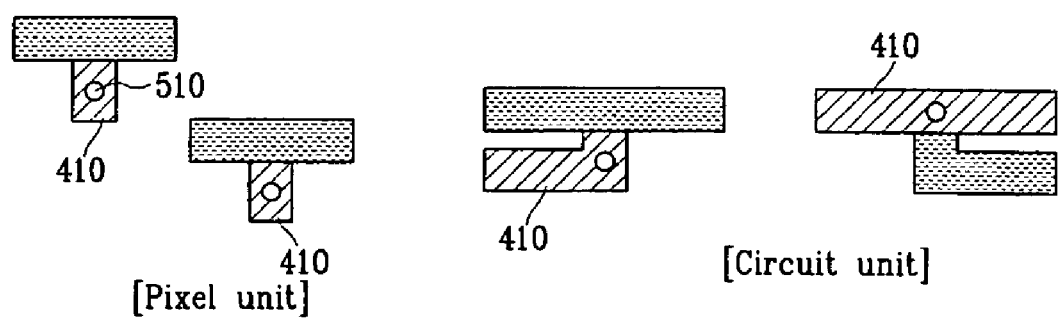

When the dopant is implanted, bodies of the p+ semiconductor layer 410 are formed, and body contacts 510 for coupling the body of the p+ semiconductor layer 410 and the gate are formed as shown in FIG. 6. Gate insulation films are formed at the portions except at the body contacts 510. The gate insulation films generally, but not necessarily, used for the polycrystalline silicon TFT are made of PECVD (plasma enhanced chemical vapor deposition) applied $S_iO_2$.

Figure 7:
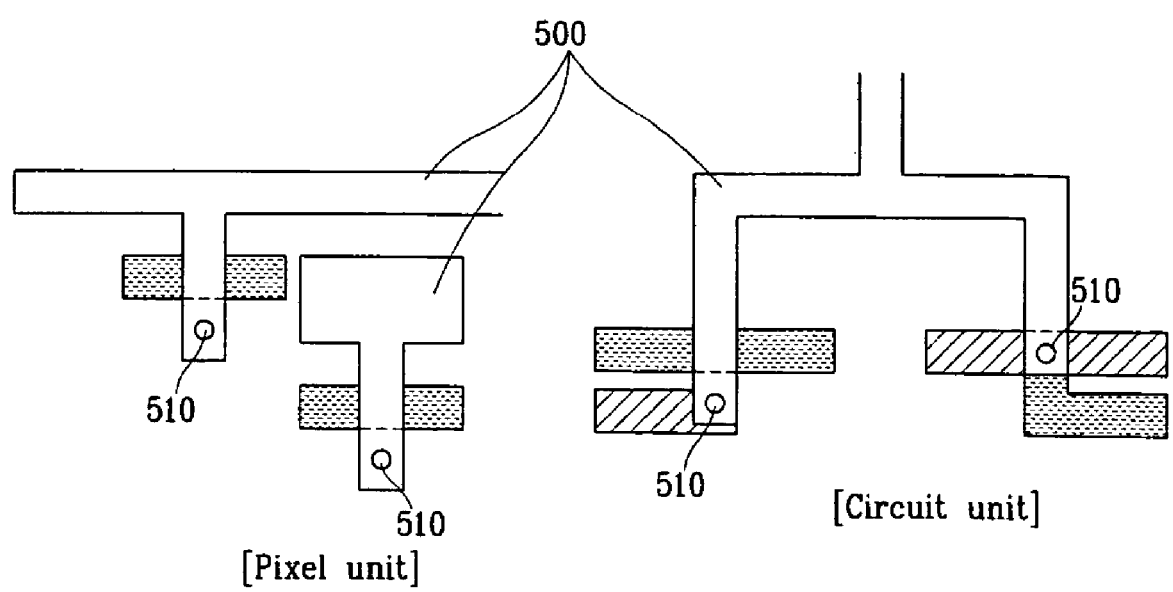

When the gate insulation films and the body contacts 510 are formed, gate metallic layers 500 are formed as shown in FIG. 7, and the gate metallic layers 500 are coupled to the body contacts 510.

Figure 8:
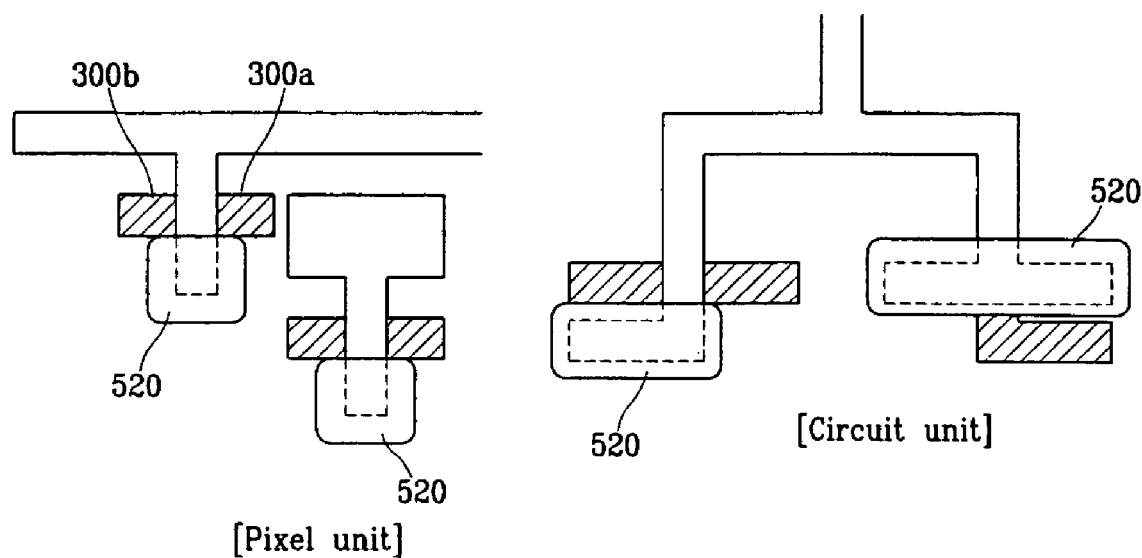

When the gate metallic layers 500 are formed, the bodies of the p+ semiconductor layer 410 are covered with masks 520 as shown in FIG. 8, and insulation films excluding the gate metallic layers 500 and the mask layers are etched to expose the semiconductor active layers 300*a* and 300*b* denoted by deviant creases.

The semiconductor active layers 300*a* and 300*b* can be exposed by using the masks in the process shown in FIG. 6 to selectively deposit the insulation films, thereby exposing the semiconductor active layers 300*a* and 300*b* without accumulating the insulation films from the earlier stage, instead of using the etching process.

The dopant is implanted into the exposed active layers 300*a* and 300*b* to perform doping. The implanted dopant has a polarity opposite to that of the implanted dopant shown in FIG. 5. Sources and drains are respectively formed in the doping process.

Figure 9:
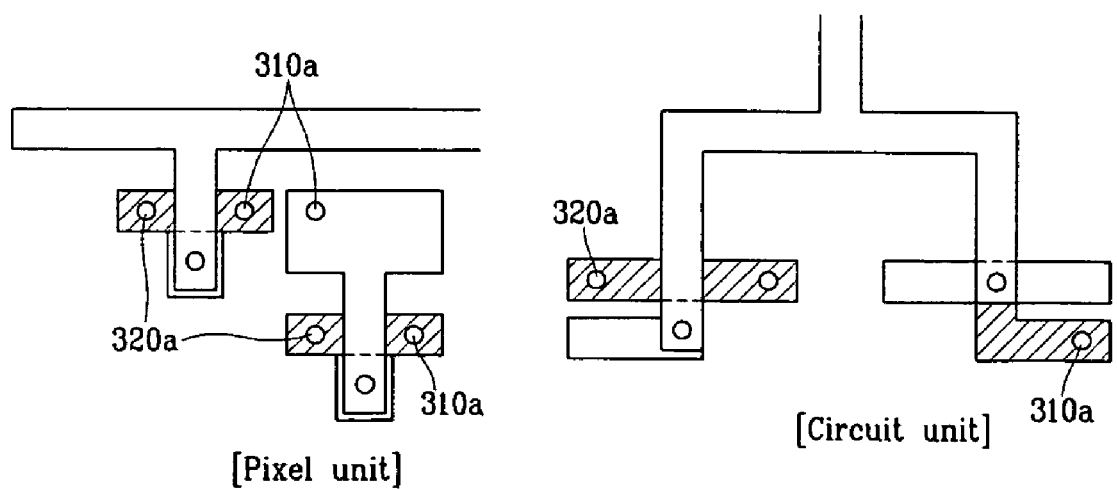

When the sources and the drains are formed through the doping process, contacts 310*a* and 320*a* of the sources and the drains are formed as shown in FIG. 9, and are accessed to scan lines and driving lines to thus perform On/Off operations.

A process of forming a glass substrate 100 and a buffer oxide film 200 can be added before the processes of FIGS. 4 to 9, which is optional to a person skilled in the art, according to the TFT manufacturing purpose. Also, as known from FIGS. 4 to 9, the doped body of the p+ semiconductor layer 410 is accessed to the gate so as to not interfere with the channel between the source and the drain.

As described, the TFT having a low threshold voltage is manufactured by using the conventional TFT manufacturing process without an additional process.

Figure 10:
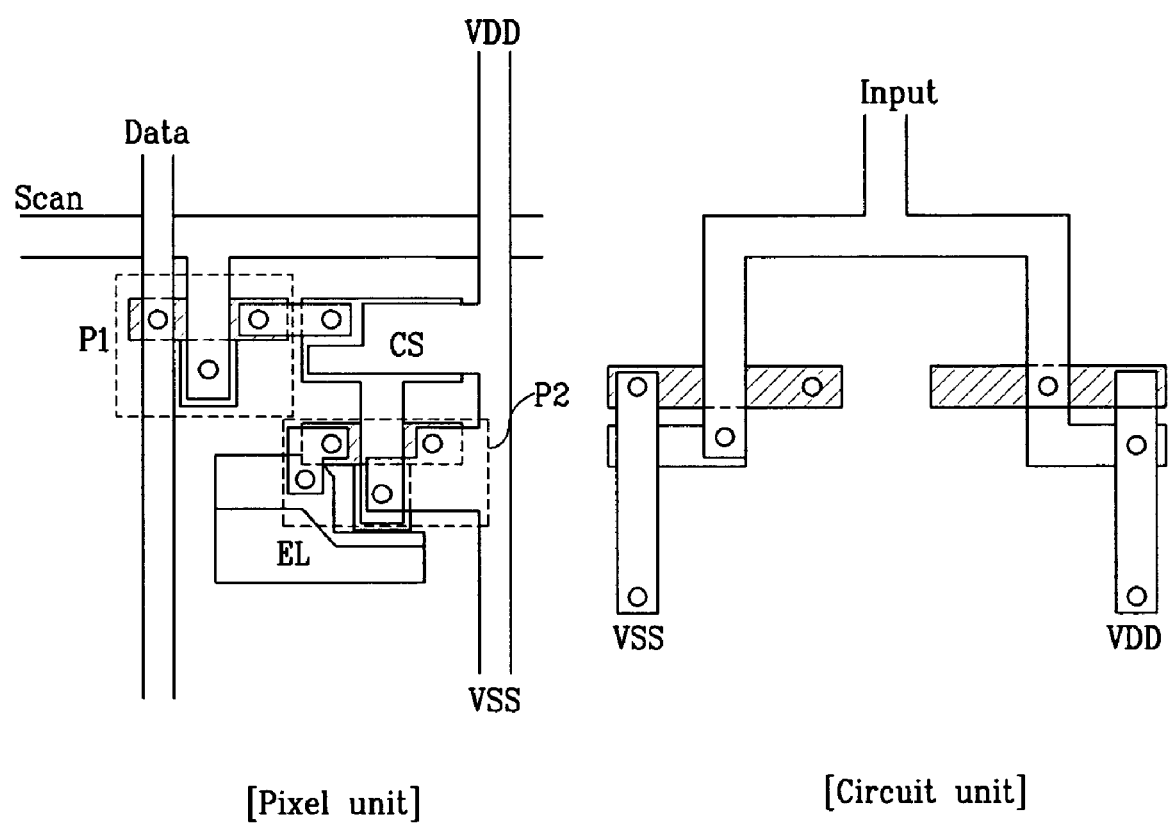
FIG. 10 shows a pixel unit and a circuit unit according to an embodiment of the present invention.

FIG. 10 shows a pixel unit and a circuit unit which are completed according to an embodiment of the present invention.

The pixel unit manufactured by the process shown in FIG. 4 to 9 is further coupled to a scan line, a data line, a power line, and a light emitting element (EL).

A TFT in the pixel unit is operated by a switching transistor P1 and a driver transistor P2. When the switching transistor P1 is selected, according to a scan signal provided through a scan line, the voltage applied to the data line is charged in the capacitor Cs. The current flowing to the light emitting element (EL) is determined by the voltage charged in the capacitor Cs.

An input line of the circuit unit is coupled to a first voltage source and a second voltage source. The circuit unit shown in FIG. 10 is usable as an inverter in the driver of the display device.

Figure 11:
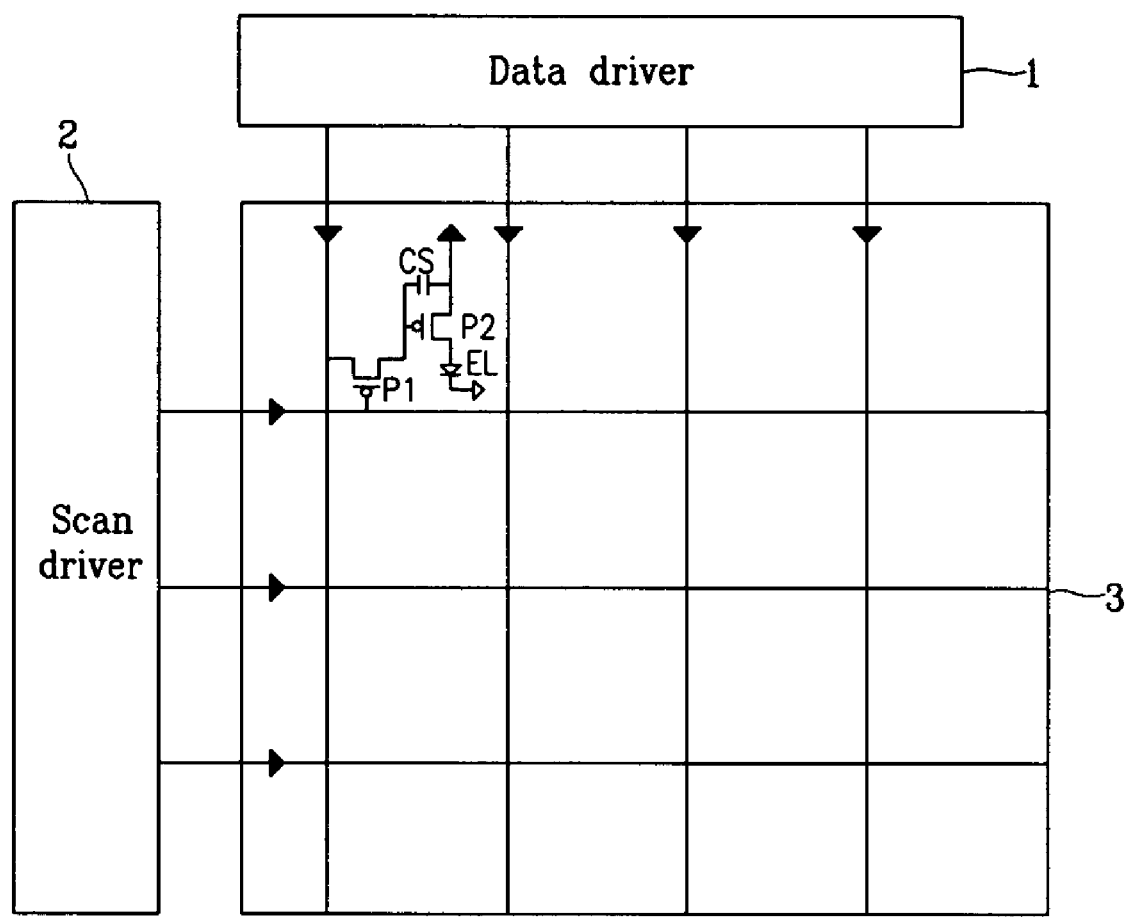
FIG. 11 shows a display device according to an embodiment of the present invention.

FIG. 11 shows a display device according to an embodiment of the present invention.

The display device 3 comprises a plurality of pixels, including a plurality of data lines coupled to a data driver 1, and TFTs P1 and P2 coupled to the scan lines coupled to a scan driver 2.

FIG. 11 shows a display device including a pixel having two TFTs, however, the pixel configuration is not restricted to the configuration shown in FIG. 11.

The body bias with respect to the source is varied by coupling the body including the dopant to the gate, thereby dynamically controlling the threshold voltage. Therefore, power consumption is minimized since a high drain current is obtained by using a low gate voltage at the turn-on time, and costs are saved since less power is used for TFT-using electronic devices. Also, the leakage current is minimized since the drain current is reduced at the turn-on time, and, accordingly, a constant image level is provided by the display.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A TFT (thin film transistor) comprising:
   a gate metallic layer;
   a body layer doped with a dopant having a first polarity;
   a source layer doped with a dopant having a second polarity;
   a drain layer doped with the dopant having the second polarity;
   a semiconductor layer formed between the source layer and the drain layer;
   an oxide film layer formed between the gate metallic layer and the semiconductor layer; and
   a contact coupling the gate metallic layer and the body layer,
   wherein the body layer is enveloped by the semiconductor layer, and is formed separately from a channel coupling the source layer and the drain layer.

2. The TFT of claim 1, wherein the body layer forms a forward bias with respect to the source layer in response to a gate voltage being applied to the gate metallic layer.

3. The TFT of claim 1, wherein the semiconductor layer comprises polycrystalline silicon.

4. The TFT of claim 2, further comprising a glass substrate layer below the semiconductor layer.

5. The TFT of claim 3, further comprising a glass substrate layer below the semiconductor layer.

6. The TFT of claim 4, further comprising a buffer oxide layer between the glass substrate layer and the semiconductor layer.

7. The TFT of claim 5, further comprising a buffer oxide layer between the glass substrate layer and the semiconductor layer.

8. The TFT of claim 1, wherein the dopant having the first polarity is a p+ type dopant, and the dopant having the second polarity is an n+ type dopant.

9. The TFT of claim 1, wherein the dopant having the first polarity is an n+ type dopant, and the dopant having the second polarity is a p+ type dopant.

10. The TFT of claim 1, wherein the semiconductor layer comprises amorphous silicon.

11. A display including a plurality of data lines coupled to a data driver, and a plurality of pixels each including a TFT (thin film transistor) coupled to a scan line coupled to a scan driver, wherein the TFT comprises:
    a gate metallic layer;
    a body layer doped with a dopant having a first polarity;
    a source layer doped with a dopant having a second polarity;
    a drain layer doped with the dopant having the second polarity;
    a semiconductor layer formed between the source layer and the drain layer;
    an oxide film layer formed between the gate metallic layer and the semiconductor layer; and
    a contact coupling the gate metallic layer and the body layer,
    wherein the body layer is enveloped by the semiconductor layer, and is formed separately from a channel coupling the source layer and the drain layer.

12. The TFT of claim 11, wherein the body layer forms a forward bias with respect to the source layer in response to a gate voltage being applied to the gate metallic layer.

13. The TFT of claim 11, wherein the semiconductor layer comprises polycrystalline silicon.

14. The TFT of claim 11, further comprising a glass substrate layer below the semiconductor layer.

15. The TFT of claim 14, further comprising a buffer oxide layer between the glass substrate layer and the semiconductor layer.

16. A TFT comprising:
a gate;
a source;
a drain;
a body coupled to the gate; and
a semiconductor layer, wherein the body is wrapped by the semiconductor layer, and has a different polarity from the source and drain.

17. The TFT of claim 16, wherein the body forms a forward bias with respect to the source in response to a voltage being applied to the gate.

18. The TFT of claim 16, wherein the body is formed of n+ type silicon, and the source and drain are formed of p+ type silicon.

19. The TFT of claim 16, wherein the body is formed of p+ type silicon, and the source and drain are formed of n+ type silicon.

20. A TFT (thin film transistor) comprising:
a gate metallic layer;
a body layer doped with a dopant having a first polarity;
a source layer doped with a dopant having a second polarity;
a drain layer doped with the dopant having the second polarity;
a semiconductor layer formed between the source layer and the drain layer;
an oxide film layer formed between the gate metallic layer and the semiconductor layer; and
a contact coupling the gate metallic layer and the body layer,
wherein the body layer is surrounded by the semiconductor layer formed between the source layer and the drain layer, and the body layer is formed separately from a channel coupling the source layer and the drain layer.

21. A TFT (thin film transistor) comprising:
a gate metallic layer;
a body layer doped with a dopant having a first polarity;
a source and a drain layer doped with a dopant having a second polarity;
a semiconductor layer formed between the source layer and the drain layer;
an oxide film layer formed between the gate metallic layer and the semiconductor layer; and
a contact coupling the gate metallic layer and the body layer,
wherein the semiconductor layer encloses the body layer, and the body layer is formed separately from a channel coupling the source layer and the drain layer.

* * * * *

UNITED STATES PATENT AND TRADEMARK OFFICE
CERTIFICATE OF CORRECTION

| | |
|---|---|
| PATENT NO. | : 7,274,036 B2 |
| APPLICATION NO. | : 10/910350 |
| DATED | : September 25, 2007 |
| INVENTOR(S) | : Byoung-Deog Choi et al. |

It is certified that error appears in the above-identified patent and that said Letters Patent is hereby corrected as shown below:

Column 7, line 25, change "ATFT" to --A TFT--.

Signed and Sealed this

Eleventh Day of December, 2007

JON W. DUDAS
*Director of the United States Patent and Trademark Office*